(12) United States Patent  
Pan (10) Patent No.: US 7,741,670 B2  
(45) Date of Patent: Jun. 22, 2010

(54) SEMICONDUCTOR DECOUPLING CAPACITOR

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 265 days.

(21) Appl. No.: 11/239,341

(22) Filed: Sep. 30, 2005

(65) Prior Publication Data

US 2007/0075341 A1    Apr. 5, 2007

(51) Int. Cl.
  *H01L 27/108*    (2006.01)
(52) U.S. Cl. .............. 257/306; 257/300; 257/307; 257/311; 257/E27.094; 257/E29.343
(58) Field of Classification Search .......... 257/298, 257/300, 306–307, 311, 532, E27.094, E29.343
  See application file for complete search history.

(56) References Cited

U.S. PATENT DOCUMENTS 4,449,142 A * 5/1984 Tsuchiya et al. ............ 257/261
5,148,393 A * 9/1992 Furuyama ................... 365/149
6,146,939 A * 11/2000 Dasgupta .................... 438/251
6,693,316 B2 * 2/2004 Tanaka et al. ............... 257/299

* cited by examiner

*Primary Examiner*—Matthew E Warren
(74) *Attorney, Agent, or Firm*—Sterne, Kessler, Goldstein & Fox, P.L.L.C.

(57) ABSTRACT

A semiconductor capacitor that includes a plurality of overlapping conductive layers and a field-effect transistor. The plurality of conductive layers include a first and second conductive layers that are spaced apart to creating a capacitance between the plurality of layers. In the semiconductor capacitor, the FET has a source, a drain and a gate. When the FET is in conduction mode, a capacitance is created between the gate and the conductive path in the semiconductor substrate between the source and the drain. The semiconductor capacitor's total capacitance is increased by coupling the drain and the source to the first conductive layer and coupling the gate to the second conductive layer.

41 Claims, 9 Drawing Sheets

SEMICONDUCTOR DECOUPLING CAPACITOR

BACKGROUND OF THE INVENTION

1. Field of the Invention

The present invention relates to semiconductor devices, more particularly, to an apparatus for increasing the capacitance of a semiconductor device.

2. Background

Sensitive circuits, particularly analog circuits, prefer a clean (i.e. noiseless) direct current (DC) power supply. A DC power supply may become noisy due to the effects of AC coupling. AC coupling occurs when stray capacitance and/or mutual inductance of nearby conductors becomes coupled to the DC power supplying line. One way to ensure a clean DC power supply is to attach a decoupling capacitor to the power supply and in proximity to the load.

However, making large capacitor in small semiconductor devices is difficult because it requires lots of space, which is lacking in small semiconductor devices. As such, what is needed is a semiconductor capacitor that efficiently utilizes valuable semiconductor space to obtain a large decoupling capacitance.

BRIEF DESCRIPTION OF THE DRAWINGS/FIGURES

The present invention is described with reference to the accompanying drawings.

DETAILED DESCRIPTION OF THE INVENTION

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

An embodiment of the present invention is now described. While specific methods and configurations are discussed, it should be understood that this is done for illustration purposes only. A person skilled in the art will recognize that other configurations and procedures may be used without departing from the spirit and scope of the invention.

Figure 1:
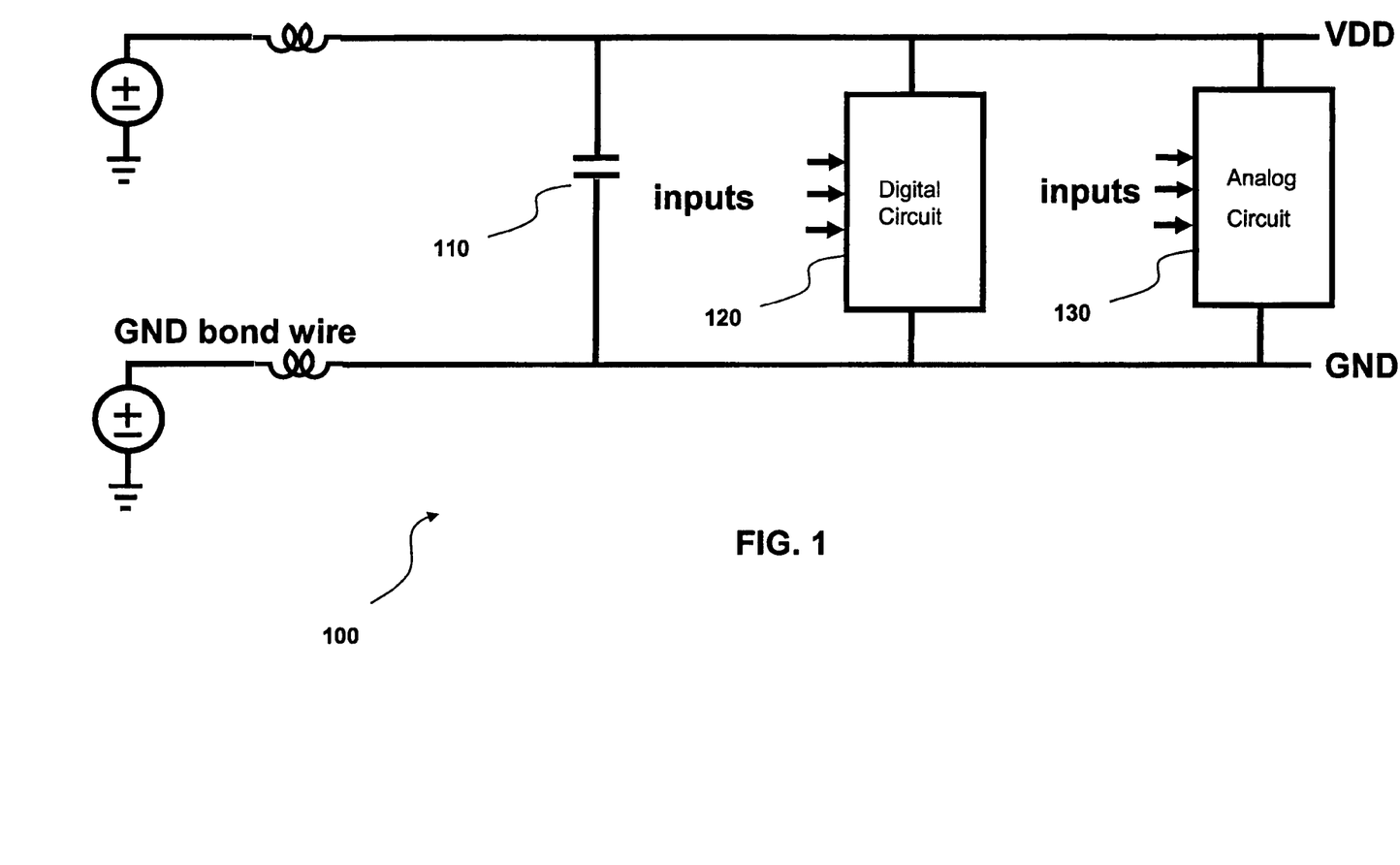
FIG. 1 illustrates an exemplary circuit using an embodiment of the present invention.

For example, FIG. 1 shows a circuit 100 that utilizes a decoupling capacitor 110 for providing reduced noise DC power to digital circuit 120 and analog circuit 130. Decoupling capacitor 110 works by shorting out high frequency signals in the power supply to ground. When capacitor 110 experiences high frequency signals, its impedance becomes proportionally smaller. Larger capacitance means more noise will be filtered.

Figure 2A:
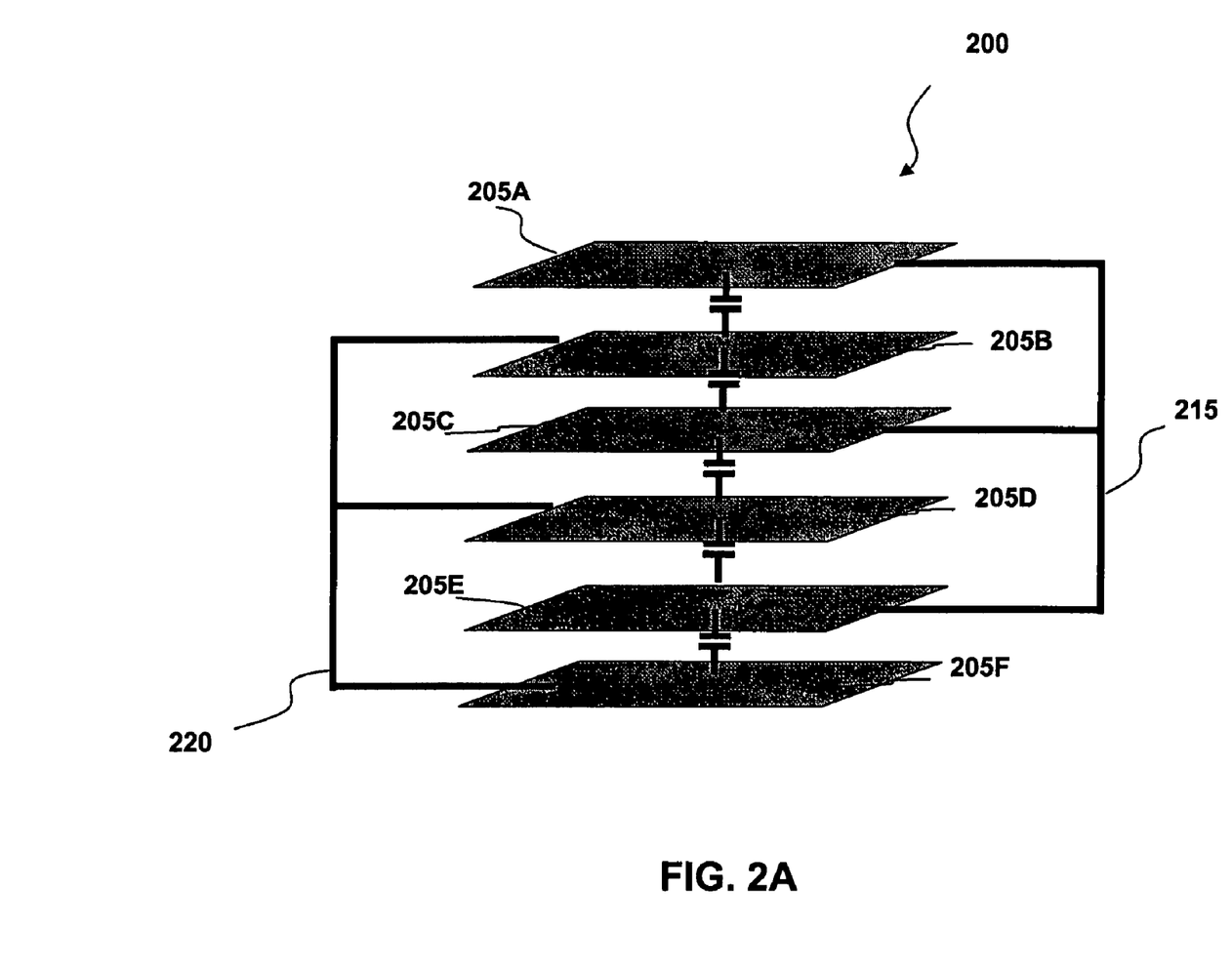
FIGS. 2A-C illustrate example capacitor structures in a semiconductor device.

FIG. 2A illustrates a capacitor stack 200. Stack 200 includes a plurality of conductive plates such as plates 205A-F. Each of the plurality of conductive plates is spaced apart. In stack 200, each of the plates is electrically coupled to a ground 220 or a voltage source 215 thus creating oppositely charged parallel plates to produce capacitance. For example, plates 205A, 205C, and 205E are coupled to voltage source 215 and plates 205B, 205D, and 205F are coupled to ground 220. Conductive plates 205A, 205C, and 205E can be referred to as a first group of conductive plates. Similarly, conductive plates 205B, 205D, and 205F can be referred to as a second group of conductive plates. In this manner, an overall capacitance is achieved for stack 200.

Figure 2B:
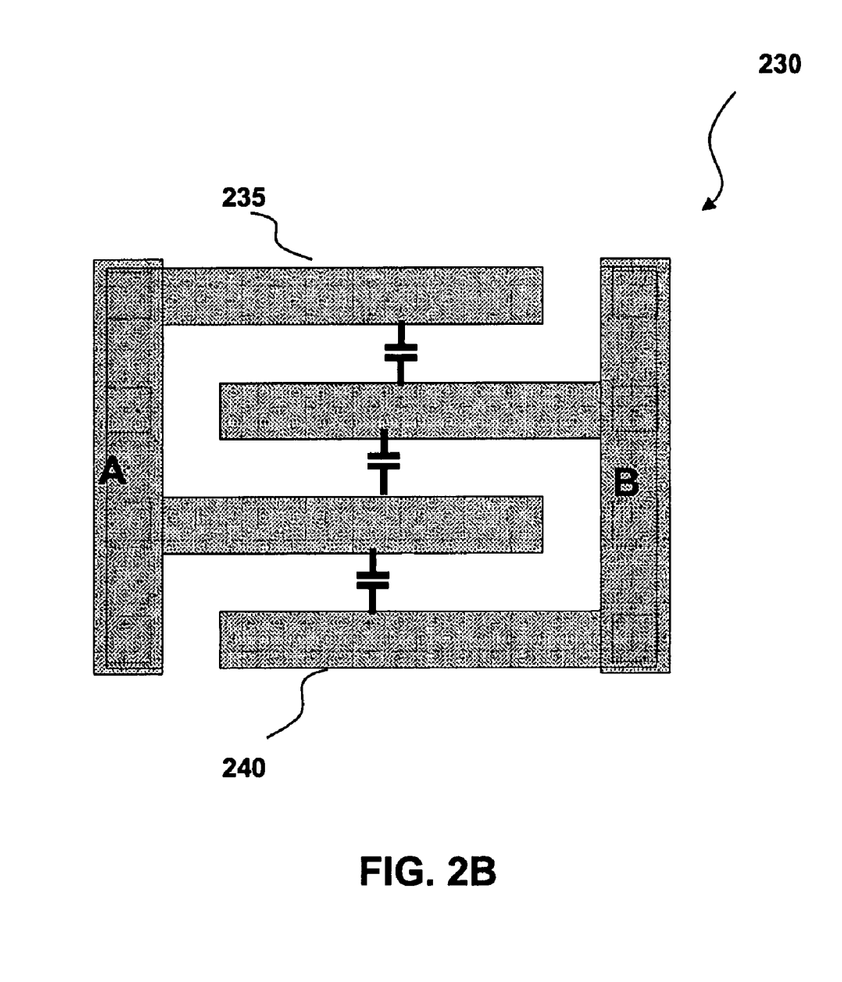

FIG. 2B shows an alternative inter-digital capacitor 230 that may be used in making a semiconductor capacitor. Inter-digital capacitor 230 includes metal fingers 235 and 240. Similar to plates 205A-F, fingers 235 and 240 are also coupled to a ground and a voltage source respectively. In this way, total capacitance for inter-digital capacitor 230 is obtained.

Figure 2C:
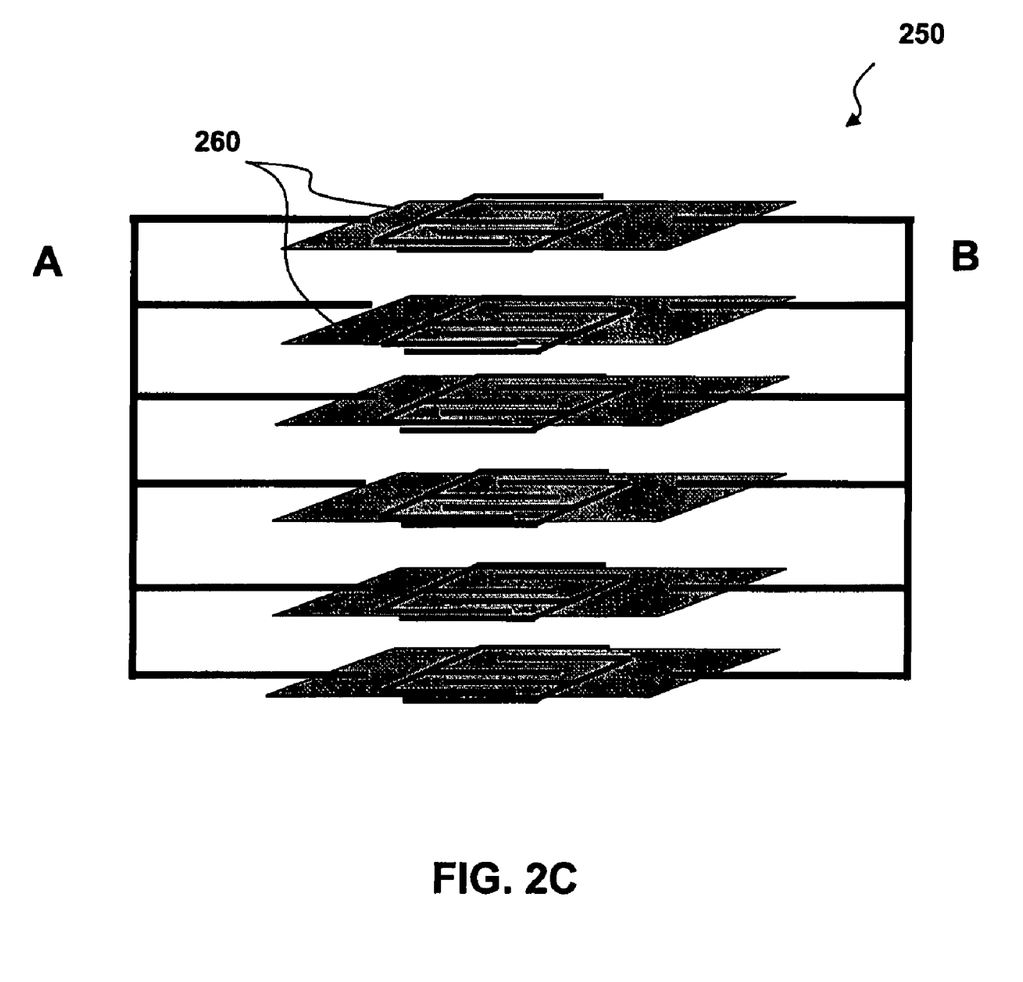

FIG. 2C shows another scheme to increase the overall capacitance of a semiconductor device. Capacitor stack 250 includes a plurality of layers 260.

Each of layers 260 includes at least one inter-digital capacitor 230. Layers 260 are electrically coupled to each other, thus providing an augmented overall capacitance for stack 250.

Figure 3:
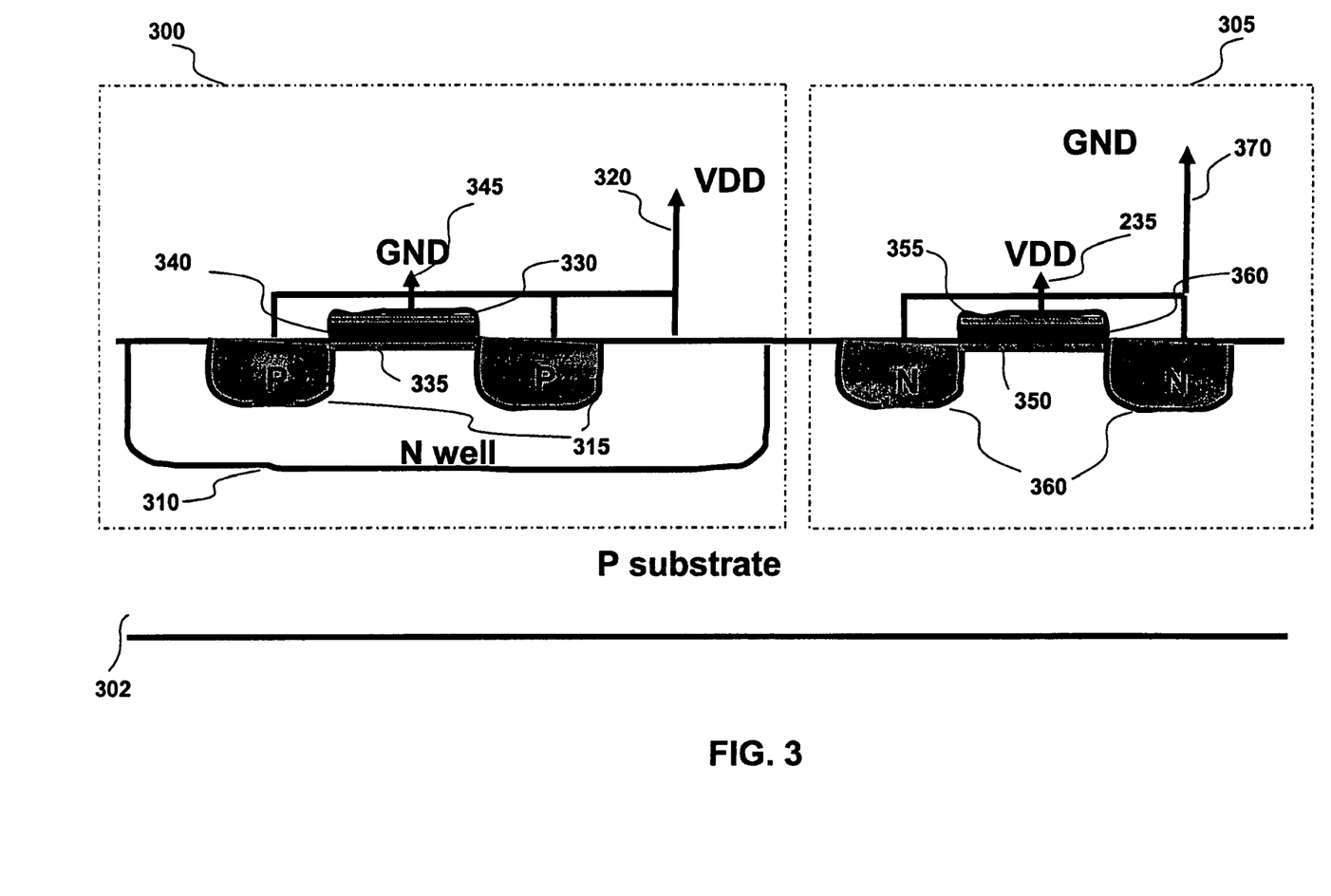
FIG. 3. illustrates examples of a metal oxide semiconductor field effect transistor used in embodiments of the present invention.

FIG. 3 shows a pair of MOSFETs 300 and 305 configured to provide additional capacitance to the overall semiconductor capacitor system (not shown). Both MOSFETs 300 and 305 are created on a substrate 302. Substrate 302 is preferably made with a P type substrate. In a silicon based substrate, a p type substrate is produced by doping the substrate with acceptor dopant (p-type) such as boron. Alternatively, in a gallium arsenide based substrate, carbon, beryllium or zinc could be used as the acceptor dopants.

MOSFET 300 is a P channel MOSFETs. MOSFET 300 includes a N type well portion 310 formed on substrate 302. N type well portion 310 is made by first masking substrate 302 and leaving an area of substrate 302 exposed. The exposed area is then doped using N type dopants to form N well portion 310. MOSFET 300 further includes two P type regions 315, an insulating layer 340, and a gate 330. P type regions 315 are created within the N type well portion 310. Regions 315 are created by doping the desired area with P type (acceptor) dopants such as boron for silicon based substrate. Regions 315 are highly P doped as compared to substrate 302.

Similar to the manufacturing process of N well portion 310, P type regions 315 are produced by first masking a surface and leaving portion of the surface unmasked. The unmasked area is then exposed with P type dopant.

Gate 330 is separated from the substrate 302 and P regions 315 by an insulating later 340. Insulating layer 340 is typically an oxide material. Gate 330 may be made from metal or polysilicon (doped silicon), or other suitable materials. Depending upon whether a MOSFET is an enhancement or depletion MOSFET, Gate 330 induces conduction between the two P regions with the present or absent of its electric field, respectively. In an embodiment, MOSFET 300 is an enhancement MOSFET. In an enhancement MOSFET, there is no conduction between the two P regions 315 unless gate 330 is positively biased with respect to the source so as to create a conducting channel.

When MOSFET 300 is in conduction mode, a conduction or an inversion channel 335 is created on the surface of N well portion 310. For a P channel MOSFET, such as MOSFET 300, holes are propagated in conduction channel 335 between the two P regions 315. Further, in MOSFET 300, gate 330 is coupled to ground, and the drain and source (P regions 315) are coupled to a voltage source $V_{DD}$. P regions 315 and channel 335 function as a first plate of a capacitor formed by MOSFET 300. Gate 330 functions as a second plate of the same capacitor with insulating layer 340 separating the first and second plate. In this way, the potential difference between conduction channel 335 and gate 330 creates a capacitance between them.

FIG. 3 also shows a N channel MOSFET 305 according to an embodiment of the present invention. MOSFET 305 includes a drain and a source that are formed by two N type regions 360 within substrate 302. N type regions 360 are spaced apart within substrate 302. A thin insulating layer separates a gate 355 from substrate 302 between region 360. In MOSFET 305, the drain and the source (the two N type regions 360) are coupled to ground, and gate 355 is coupled to a voltage source. In this manner, a difference in voltage potential is created between gate 355 and a conduction channel 350 when MOSFET 305 is in conduction mode. Thus, a capacitance is generated between gate 355 and conduction channel 350. For a N channel MOSFET, electrons are propagated between the two N type regions 360 in the conduction channel 350.

In an embodiment, MOSFET 305 is an enhancement MOSFET. As mentioned, there is no conduction between the two N regions 360 in an enhancement MOSFET unless gate 355 is biased with respect to the source. In an alternative embodiment, MOSFET 305 is a depletion MOSFET. In a depletion MOSFET, conduction channel 350 experiences conduction even when the gate is not biased.

Figure 4:
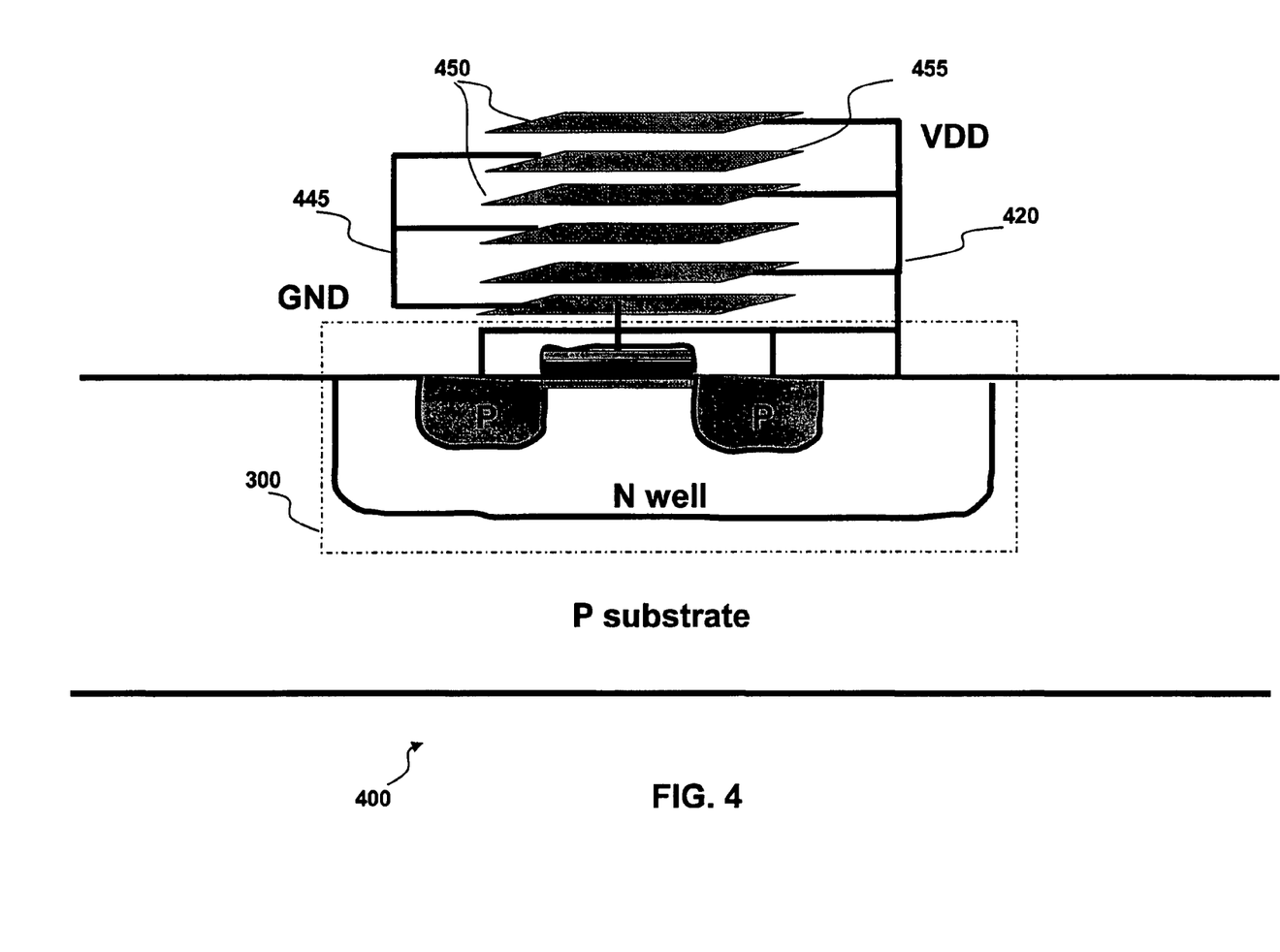
FIGS. 4-7 illustrate examples of a semiconductor capacitor according to embodiments of the present invention.

FIG. 4 shows a semiconductor capacitor 400. Semiconductor capacitor 400 includes MOSFET 300 that is electrically coupled to a plurality of conductive plates 450 and 455. In semiconductor 400, the drain and source of MOSFET 300 are connected a voltage source 420 and to conductive plate 450. Further, the gate of MOSFET 300 is connected to conductive plates 455 which are coupled to a ground 445. In this way, a higher overall capacitance is achieved by combining the capacitances between the plurality of plates with the capacitance of MOSFET 300.

Figure 5:
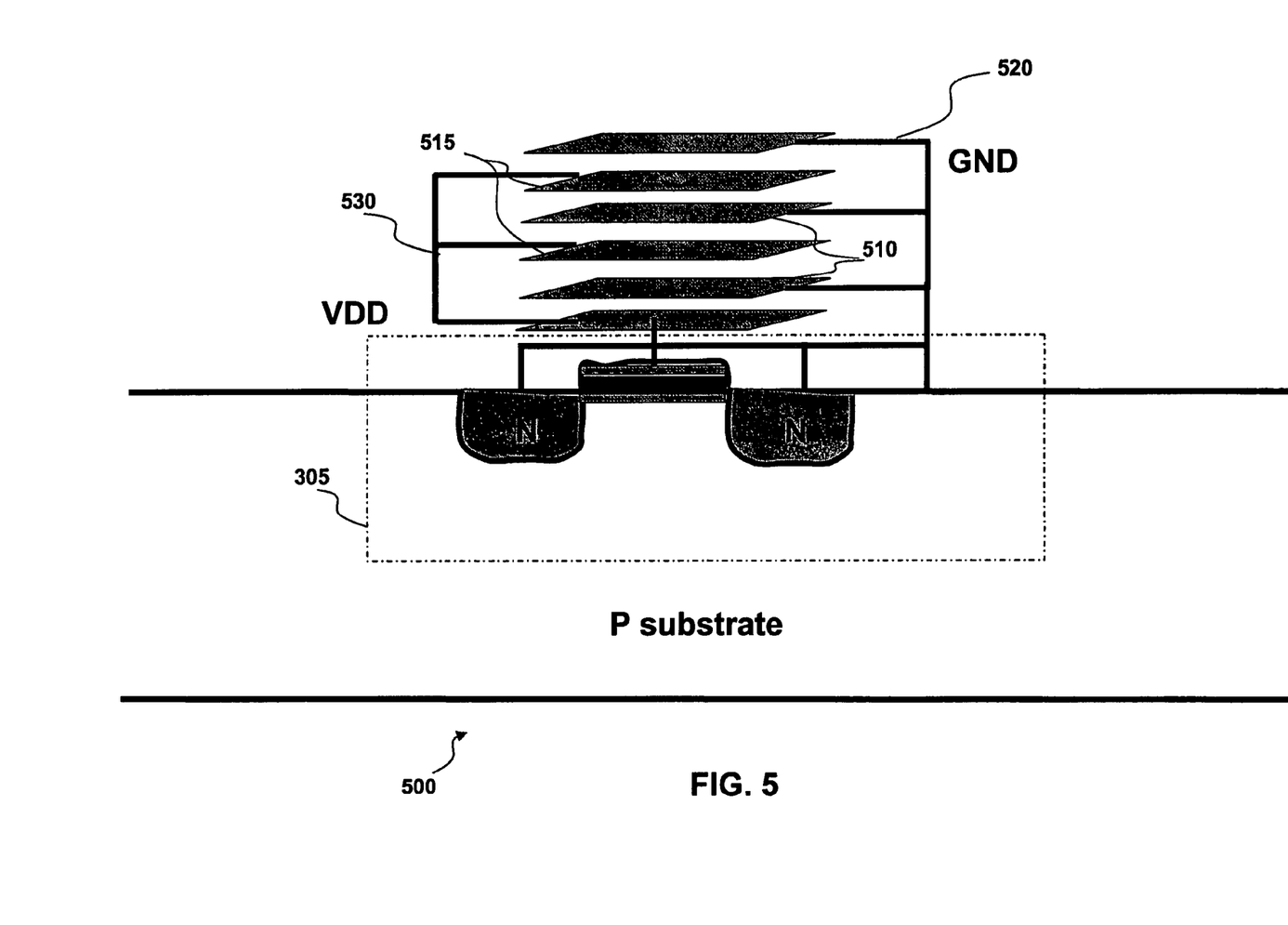

FIG. 5 shows a semiconductor capacitor 500. Semiconductor capacitor 500 includes MOSFET 305 that is electrically coupled to a plurality of conductive plates 510 and 515. In semiconductor 500, the drain and source of MOSFET 305 are connected a ground 520 and to conductive plates 510. Further, the gate of MOSFET 400 is connected to conductive plates 515 which are coupled to a voltage source 530. In this way, semiconductor capacitor 500 obtains a larger capacitance by combining the capacitive effects of the plurality of plates 510 and 515 with the capacitive effects of MOSFET 305.

Figure 6:
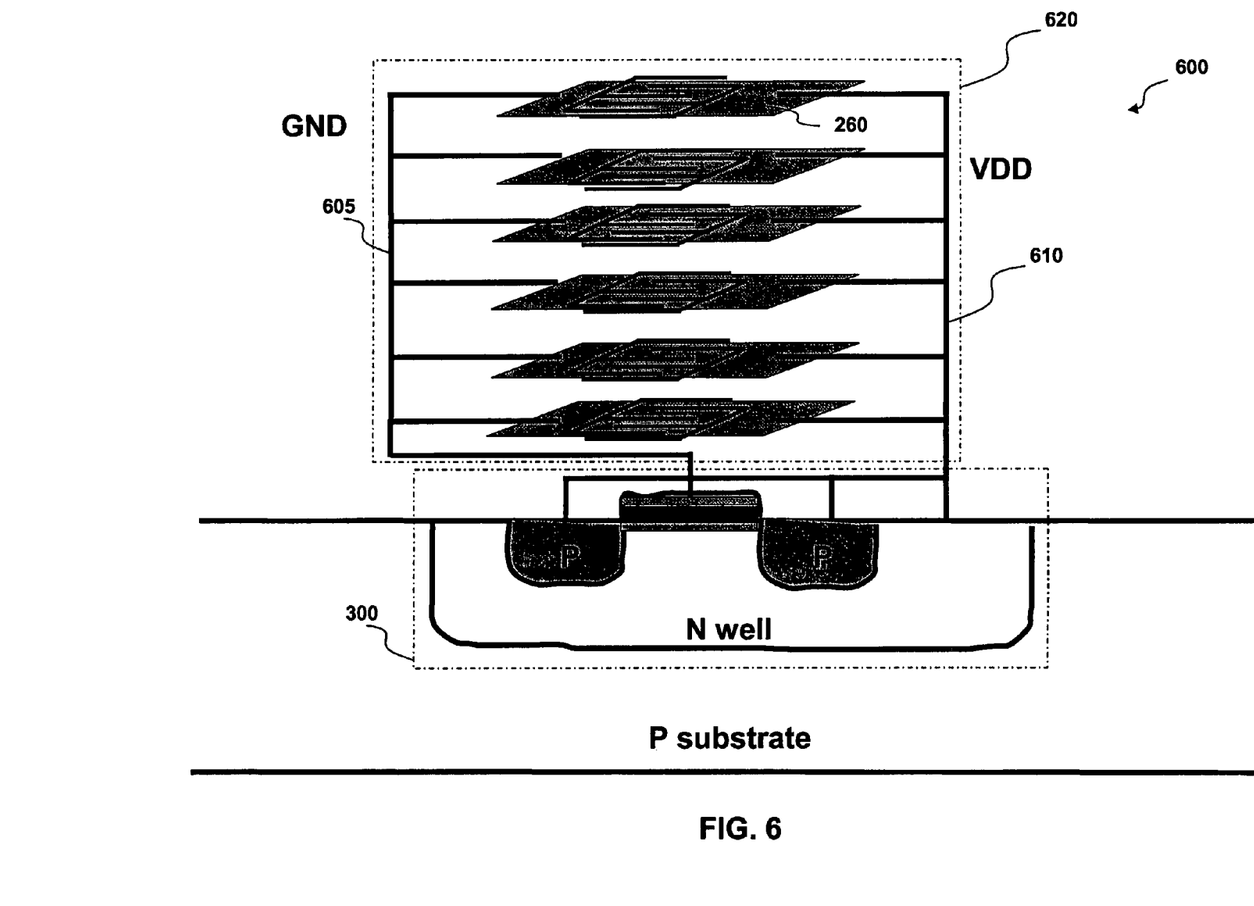

FIG. 6 shows an alternative embodiment of a semiconductor capacitor 600 that includes P channel MOSFET 300 and a plurality of capacitive layers 610. Each of the capacitive layers 610 includes a capacitor arrangement similar to the arrangement shown in FIG. 2C, with inter-digital capacitor 230. Each of the capacitive layers 610 is also connected to a common ground 605 and a voltage source 610. In this way, the capacitance of each of the layers is combined with the overall capacitive system. In semiconductor capacitor 600, the gate of MOSFET 300 is also connected to ground 605. The drain and the source are connected to voltage source 610. This arrangement increases the overall capacitance of semiconductor capacitor 600 by incorporating the capacitance between the gate and the conduction channel of MOSFET 300.

Figure 7:
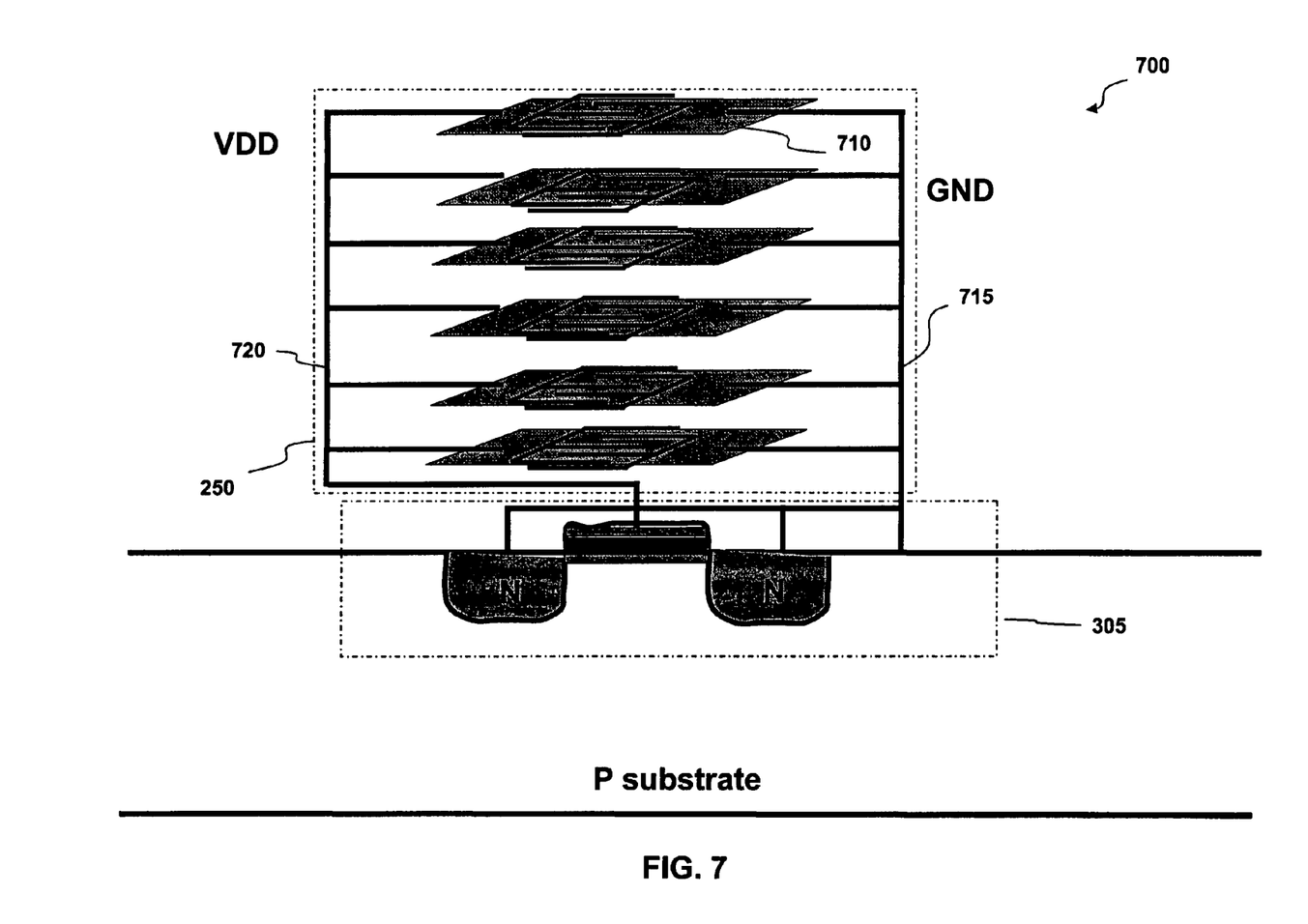

FIG. 7 shows yet another alternative embodiment of a semiconductor capacitor 700 that includes N channel MOSFET 305 and a plurality of capacitive layers 710. Each of the capacitive layers 710 includes a capacitor arrangement similar to the arrangement shown in FIG. 2C, with inter-digital capacitor 230. Layers 710 are electrically coupled, thus providing an increased capacitance for capacitor 700. In semiconductor capacitor 700, each of the capacitive layers 710 of capacitor stack 250 is also connected to a common ground 715 and a voltage source 720. In this way, the capacitance of each of the layers is combined with the overall capacitive system. In semiconductor capacitor 700, the drain and the source of MOSFET 305 are connected to ground 715. Further, the gate of MOSFET 305 is connected to voltage source 720. This arrangement increases the overall capacitance of semiconductor capacitor 700 by coupling the capacitive reservoirs in stack 250 and MOSFET 305.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

We claim:

1. A semiconductor capacitor, comprising:
   a first plurality and a second plurality of overlapping metal layers that create a first capacitance between the first and second plurality of metal layers, wherein each layer of the first and second plurality of metal layers includes at least one inter-digital capacitor; and
   a field-effect transistor (FET) having a source, a drain, and a gate, wherein a bias of said FET is controlled by biasing said source, drain, and gate with respect to each other;
   wherein a second capacitance is created between the gate and a conductive path between the source and the drain when the FET is in conduction mode; and
   wherein the semiconductor capacitor's total capacitance is increased by coupling the drain and the source to the first plurality of metal layers and coupling the gate to the second plurality of metal layers.

2. The semiconductor device of claim 1, wherein the FET is a metal-oxide-semiconductor FET (MOSFET).

3. The semiconductor device of claim 2, wherein the MOSFET is a P channel MOSFET.

4. The semiconductor device of claim 2, wherein the MOSFET is a N channel MOSFET.

5. The semiconductor device of claim 1, wherein the FET is a junction FET (JFET).

6. The semiconductor device of claim 5, wherein the JFET is a N or P channel JFET.

7. The semiconductor device of claim 2, wherein the MOSFET is a depletion or enhancement MOSFET.

8. The semiconductor device of claim 3, wherein the first plurality of metal layers, the drain and the source are coupled to a voltage source.

9. The semiconductor device of claim 3, wherein the second plurality of metal layers and the gate are coupled to ground.

10. The semiconductor device of claim 4, wherein the first plurality of metal layers, the drain and the source are coupled to ground.

11. The semiconductor device of claim 4, wherein the second plurality of metal layers and the gate are coupled to a voltage source.

12. A semiconductor capacitor, comprising:
a first plurality and a second plurality of spaced apart metal layers creating a first capacitance between the first plurality and the second plurality of metal layers; and
a field-effect transistor (FET) comprising:
a substrate;
a source formed on the substrate;
a drain formed on the substrate; and
a gate,
wherein a bias of said FET is controlled by biasing said source, drain, and gate with respect to each other;
wherein a second capacitance is created between the gate and a conductive path in the substrate, the conductive path is created by movements of current between the source and the drain when the FET is in conduction, and
wherein an augmented capacitance is created by combining the first and second capacitances through coupling the drain and the source to the first plurality of metal layers and the gate to the second plurality of metal layers.

13. The semiconductor device of claim 12, wherein the FET is a metal-oxide-semiconductor FET (MOSFET).

14. The semiconductor device of claim 13, wherein the MOSFET is a P channel MOSFET.

15. The semiconductor device of claim 13, wherein the MOSFET is a N channel MOSFET.

16. The semiconductor device of claim 12, wherein the FET is a junction FET (JFET).

17. The semiconductor device of claim 16, wherein the JFET is a N channel JFET.

18. The semiconductor device of claim 16, wherein the JFET is a P channel JFET.

19. The semiconductor device of claim 13, wherein the MOSFET is a depletion or enhancement MOSFET.

20. The semiconductor device of claim 14, wherein the first plurality of metal layers, the drain and the source are coupled to a voltage source.

21. The semiconductor device of claim 14, wherein the second plurality of metal layers and the gate are coupled to ground.

22. The semiconductor device of claim 15, wherein the first plurality of metal layers, the drain and the source are coupled to ground.

23. The semiconductor device of claim 15, wherein the second plurality of metal layers and the gate are coupled to a voltage source.

24. A semiconductor capacitor comprising:
a substrate having first and second capacitor terminals;
a FET having a source, a drain, and a gate disposed on the substrate, wherein a bias of said FET is controlled by biasing said source, drain, and gate with respect to each other, the FET biased so as to form a conductive channel between the source and the drain, the source and drain are connected to the first capacitor terminal, the gate is connected to the second capacitor terminal; and
a plurality of metal layers, including a first group of metal layers coupled to the first capacitor terminal, and a second group of metal layers coupled to the second capacitor terminal.

25. The semiconductor capacitor of claim 24, wherein the FET is a metal-oxide-semiconductor FET (MOSFET).

26. The semiconductor capacitor of claim 25, wherein the MOSFET is a P channel MOSFET.

27. The semiconductor capacitor of claim 25, wherein the MOSFET is a N channel MOSFET.

28. The semiconductor capacitor of claim 24, wherein the FET is a junction FET (JFET).

29. The semiconductor capacitor of claim 28, wherein the JFET is a N or P channel JFET.

30. The semiconductor capacitor of claim 25, wherein the MOSFET is a depletion or enhancement MOSFET.

31. The semiconductor capacitor of claim 26, wherein the first capacitor terminal is coupled to a voltage source.

32. The semiconductor capacitor of claim 26, wherein the second capacitor terminal is coupled to ground.

33. The semiconductor capacitor of claim 27, wherein the first capacitor terminal is coupled to ground.

34. The semiconductor capacitor of claim 27, wherein the second capacitor terminal coupled to a voltage source.

35. The semiconductor capacitor of claim 24, wherein the first group of metal layers are electrically isolated from the second group of metal layers.

36. The semiconductor capacitor of claim 24, wherein the plurality of metal layers are vertically on top of each other, but spaced apart so as to provide electrical isolation between the first and second group of metal layers.

37. The semiconductor capacitor of claim 24, wherein the plurality of metal layers are vertically stacked on top of the FET.

38. The semiconductor device of claim 18, wherein the first plurality of metal layers, the drain and the source are coupled to a voltage source.

39. The semiconductor device of claim 18, wherein the second plurality of metal layers and the gate are coupled to ground.

40. The semiconductor device of claim 17, wherein the first plurality of metal layers, the drain and the source are coupled to ground.

41. The semiconductor device of claim 17, wherein the second plurality of metal layers and the gate are coupled to a voltage source.

* * * * *